United States Patent [19]
Miller

[11] 3,748,589
[45] July 24, 1973

[54] SYSTEM FOR CONTROLLING A VARIABLE FREQUENCY OSCILLATOR BY DIGITAL PHASE COMPARISON MEANS

[75] Inventor: Stephen B. Miller, Westport, Mass.

[73] Assignee: Bristol Electronics, Inc., New Bedford, Mass.

[22] Filed: Nov. 10, 1971

[21] Appl. No.: 197,387

[52] U.S. Cl. ........................ 331/1 A, 331/17, 331/25
[51] Int. Cl. .............................................. H03b 3/04
[58] Field of Search ......................... 331/1 A, 17, 18, 331/25

[56] References Cited

UNITED STATES PATENTS

| | | | |
|---|---|---|---|
| 3,534,285 | 10/1970 | Kobold et al. | 331/1 A X |
| 3,551,826 | 12/1970 | Sepe | 331/1 A X |
| 3,290,611 | 12/1966 | Horlacher et al. | 331/17 X |
| 3,405,369 | 10/1968 | Couvillon | 331/25 X |

OTHER PUBLICATIONS

Gill, "Use ICs in Your Phase-Locked Loop," Electronic Design, Apr. 11, 1968, pp. 76–79.

*Primary Examiner*—Roy Lake
*Assistant Examiner*—Siegfried H. Grimm
*Attorney*—Robert F. O'Connell et al.

[57] ABSTRACT

A frequency control system for controlling the output frequency of a variable frequency oscillator in accordance with a reference oscillator wherein the variable frequency oscillator and reference frequency oscillator signals are converted to pulsed form and their phases are compared to provide a phase difference signal in digital form. The phase difference signal is converted to analog form and filtered by a low-pass filter having a selected transfer characteristic to provide a phase control signal for controlling the operation of the variable frequency oscillator. The control system for producing the phase control signal can be formed as a single module unit using presently available integrated circuit chips for certain portions thereof and suitable external circuit elements in combination therewith.

2 Claims, 8 Drawing Figures

SYSTEM FOR CONTROLLING A VARIABLE FREQUENCY OSCILLATOR BY DIGITAL PHASE COMPARISON MEANS

DISCLOSURE OF THE INVENTION

This invention relates to systems for controlling the frequency of variable frequency oscillators and, more particularly, to such systems which provide for the accurate setting of a plurality of discrete frequencies derived therefrom without hunting and without instabilities which may arise because of temperature variations.

A typical use for a frequency controlled variable frequency oscillator can be found in radio transmitter-receiver systems. One specific system which has found success particularly in operation where a plurality of discrete frequency channels must be made available and must be determined accurately, as for military communications, can be found in the Department of the Army radio equipment identifiable as Radio Sets AN/PRC-25 and AN/PRC-77.

In such a system, the frequency control portion thereof, identified as a "frequency synthesizer system," comprises a closed loop, automatic phase control system which locks the variable frequency oscillator (VFO) on the desired frequency. The frequency synthesizer system is used both during reception and transmission, the variable frequency oscillator output frequency being shifted during transmission by a fixed amount below its value during reception. Frequency control is maintained by comparing the phase of the variable frequency oscillator output signal with the phase of the reference oscillator signal and feeding the phase compared output to a discriminator circuit which in turn produces an automatic phase control signal for varying the frequency of the variable frequency oscillator should the VFO signal and the reference signal not be in phase. In such a system, two module units are used, namely, a phase comparator unit and a discriminator unit, which modules are appropriately interconnected and in which modules the signal processing operation is performed completely in analog form.

One of the difficulties with such a system is that each module must be separately aligned and, if either or both such modules become misaligned, frequency control is adversely affected. Moreover, the dynamic transition of the signal from one module to another provides inherent design problems which often result in incorrect frequencies being selected or an inability of the system to lock in on any frequency at all resulting in an undesired "hunting" operation. Such a system as used in the AN/PRC-25 and AN/PRC-77 radio sets operates broadly in a two-step manner wherein a gross adjustment of frequency is effectively utilized if the frequency is displaced from the correct frequency by an amount greater than a preselected value so that the frequency is brought within a selected frequency range. A "fine" adjustment is then used to assume control of the signal whereupon the grossly adjusted frequency is locked into the specifically desired frequency once the VFO output is within such frequency range.

This invention, on the other hand, provides a simplified frequency control system, which reduces the inherent problems discussed above with reference to the dual module system, wherein the two modules are replaced by a single module unit which avoids the alignment, transition and hunting problems inherent in the two module approach.

In the system of the invention the variable frequency oscillator signal and reference frequency oscillator signal are converted from analog form to digital form to produce digitized variable and reference signals representing the phases of such analog signals.

The digital phase signals are then appropriately compared with the phase difference suitably detected to produce a phase difference signal in digital form which is then reconverted into analog form. A low-pass filter responsive to the analog signal then produces at its output the desired control signal for controlling the frequency of the variable frequency oscillator.

The use of such digital/analog approach then permits the use of integrated circuitry which is presently available for providing the operations of the digital phase comparison and detection, digital to analog conversion, and filtering to provide the desired control signal. Using up-to-date integrated circuitry techniques, all of the circuitry utilized for such latter purposes can be formed on a single chip, such a chip now being available in commercial form, as exemplified by Model MC4344L Integrated Circuit available from Motorola Corporation, Chicago, Ill. The use of a single chip for such purposes together with the ability to use additional integrated circuitry for providing the required digital phase signals permits the formation of the entire frequency control circuitry in a single module so as to overcome the disadvantages which arise because of the use of a dual module approach. Moreover, the approach of the invention permits the production of the desired control signal effectively in a single step operation as opposed to the two-step (i.e., gross and fine) frequency adjustment process of the dual module system. Further, the various problems arising because of the interface difficulties between the modules do not occur. Moreover, the use of a single chip for performing the crucial functions of the frequency control process avoids the temperature stability problems since the chip used for that purpose, as now available, is inherently temperature stabilized and can operate over the useful temperature ranges normally encountered, as in the military requirements for temperature operation from −40° C to +65° C.

A more detailed description of the invention is presented below with reference to the accompanying drawings wherein FIG. 1 shows in broad block diagram form the prior art dual module approach to frequency control;

Figure 1:
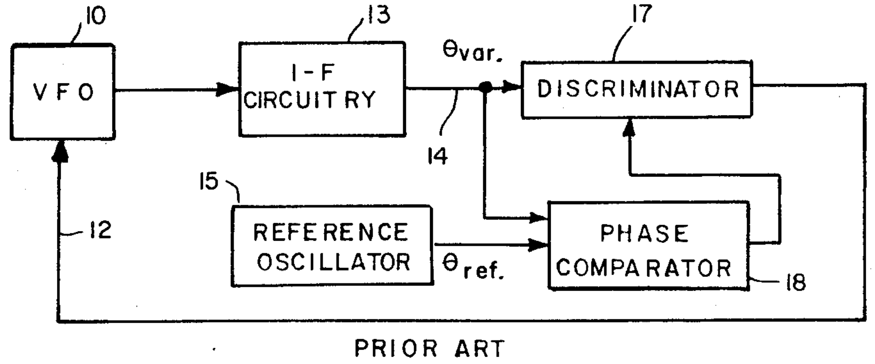

FIG. 1 shows in block diagram form a frequency control system of the prior art for use for example in an appropriate radio receiver-transmitter system. As shown therein a variable frequency oscillator 10 produces an output signal having a variable frequency, the specific value of such frequency being determined by a control signal 12. The variable frequency oscillator is utilized in appropriate *i–f* circuitry 13, the details of which are not necessary to the discussion of this invention, but which are of a generally known nature whether the system is used as a receiver or as a transmitter. At any rate, a signal representing the variable phase of the variable frequency output signal is available from *i-f* circuitry 13 as shown by the signal 14 identified as $\theta_{var}$. A reference oscillator 15 produces a reference phase signal, identified as $\theta_{ref}$. The variable phase signal is fed to the input of a discriminator circuit 17 and to the input of a phase comparator circuit 18, the other input of the latter unit being connected to the reference oscillator. The output of phase comparator 18 is then fed to discriminator 17, the latter unit being responsive to its input signals to produce the phase control output signal 12 for controlling the frequency of the variable frequency oscillator. In the formation of such a radio set in modular form, the phase comparator is formed as a first module unit and the discriminator is formed as a second module unit. In each case the phase comparator and the discriminator modules both must be separately aligned for correct operation. It has been found further that in such a system either an incorrect frequency will be obtained from the variable frequency oscillator because the interface problems between the two module units provide an inherent design problem which prevents accurate "lock-on" to the desired frequency, or the variable frequency oscillator will fail to be locked on to any frequency and will tend to oscillate, or "hunt," about an average frequency.

Figure 2:
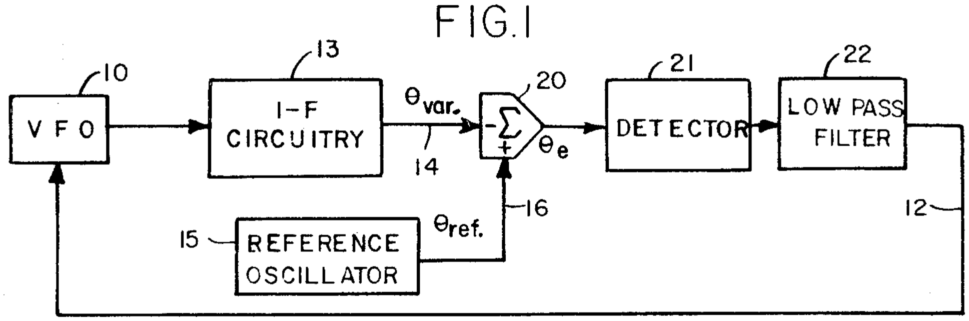
FIG. 2 shows in broad block diagram form the comparable approach of the system of the invention.

In order to avoid such problems, the system, shown in broad block diagram form in FIG. 2 in accordance with the invention, is utilized. As can be seen therein, a variable frequency oscillator 10 is shown as supplying a signal to the *i-f* circuitry 13, as above. A signal 14 (identified as $\theta_{var}$) representing the variable phaSe of the Variable frequency output signal is available from *i-f* circuitry 13, also as above. The reference oscillator 15 also produces the desired reference signal 16, again identified as $\theta_{ref}$.

In the system of the invention, the variable phase signal $\theta_{var}$ is subtracted from the reference phase signal $\theta_{ref}$ at subtraction network 20 to produce a phase difference signal, identified as $\theta_e$, which is then fed to an appropriate detector 21, the detected output of which is passed through a low-pass filter 22 to produce the desired control signal 12 used to phase control the variable frequency oscillator so as to lock the latter into the desired frequency in accordance with the setting of the reference oscillator. As discussed more completely below, the overall control system for producing the control signal 12 can be formed as a single module and the problem of alignment with the dual module unit of the prior art is avoided. Moreover, the system, as shown, avoids hunting and the variable frequency output is accurately locked into the reference oscillator signal without any hunting problem.

Figure 3:
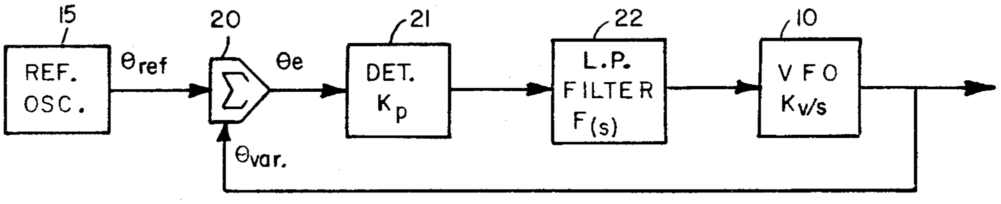
FIG. 3 shows the block diagram of FIG. 2 presented in a modified format.

The block diagram of FIG. 2 is shown in a modified format in FIG. 3 so that the operational characteristics thereof can be more readily described. As shown therein, the detector unit 21 has a transfer characteristic in the frequency domain denoted by the constant $K_p$. The transfer characteristic of the low-pass filter in the frequency domain is identified as F(s), and that of the variable frequency oscillator as $K_v/s$. The operational characteristics of the system can be determined by appropriately known servomechanism theory and it can be shown that the overall transfer characteristic $\theta_{var}/\theta_e$ for the blocks 21, 22 and 10 can be expressed as:

$$K_pF(s)K_v/s$$

The expression $\theta_{var}/\theta_{ref}$ can be written:

$$K_pF(s)K_v/s/1+K_pF(s)K_v/s$$

Such expression is comparable to the form:

$$K_1s + K_2/s^2 + K_1s + K_2$$

where $K_1 = 2z\omega$ and $K_2 = \omega^2$

If the transfer characteristic of the low-pass filter is specifically defined as:

$$R_2Cs+1/R_1Cs$$

then $K_1$ and $K_2$ can be determined as follows:

$$K_1 = 2z\omega = K_pK_vR_2/R_1/K_2 = \omega^2 = K_pK_v/R_1C$$

If we assume a design characteristic for the overall transfer function as requiring an approximate 30 percent overshoot and values of $z$=0.707, $\omega = 5/\tau_s$, $C$=1 $\mu$farad,$\tau_s$ = 1 msec., $K_p$ = 0.111 and $K_v = 1.25 \times 10^6$, then the values for the resistances of the low-pass filter can be calculated as $R_1 \approx$ 5,600 ohms and $R_2 \approx$ 300 ohms.

In implementing the configuration of FIGS. 2 and 3 with the general transfer characteristics shown, this invention makes use of an effective combined digital-/analog approach which avoids the problems discussed above with reference to the dual module, all analog approach, while at the same time permitting the use of presently available integrated circuitry for reducing the overall cost of manufacture of the control system. Such approach can be represented in block diagram form with reference to FIG. 4 wherein the variable phase signal $\theta_{var}$ and the reference phase signal $\theta_{ref}$ are each effectively converted from a true analog form via wave shaping circuitry 23 and 24 to a pulse type shape, such circuitry, for example, comprising an amplifier and limiter combination so as to provide pulse-like information to the phase detection portion of the system. The pulsed phase information obtained from wave shaping circuits 23 and 24 is then fed to phase detection circuitry, diagrammatically represented here as effectively including a summation circuit 20 and a digital phase detector 21 which produces a phase detected signal in digital form (identifiable in connection with the block diagram of FIG. 3, for example, as $K_p\theta_e$). The digital signal from phase detector 21 is then converted to analog form in a digital to analog converter 26, the analog phase signal then being fed through low-pass filter 22 to produce the output phase control signal for use in the variable frequency oscillator.

Figure 4:
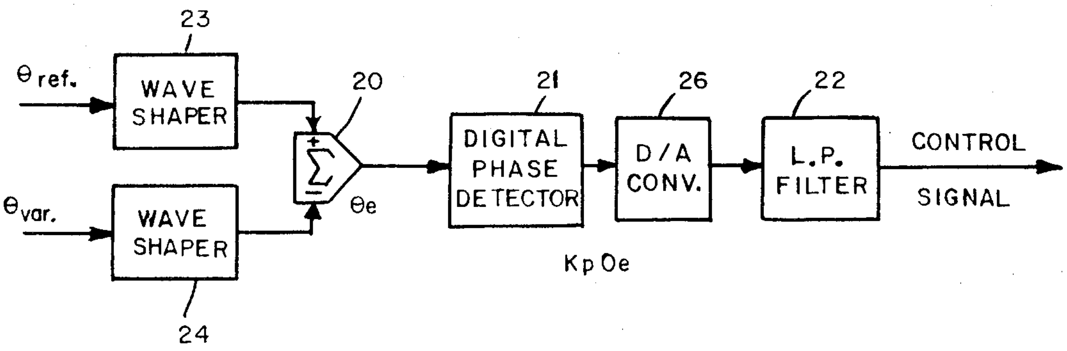
FIG. 4 shows a more detailed circuit and block diagram of the frequency control system of FIG. 3.
Figure 5:
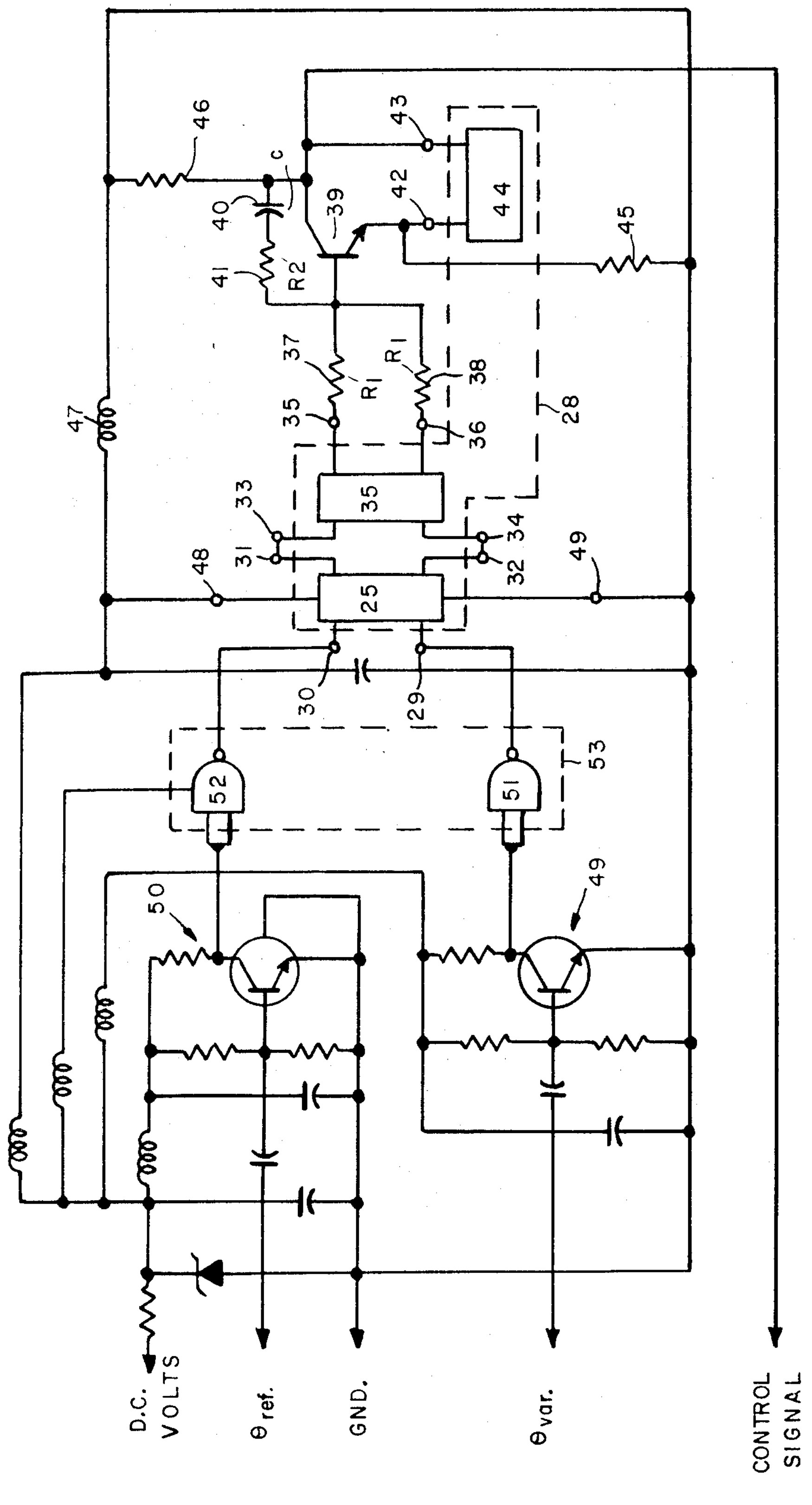
FIG. 5 shows more detailed circuit diagrams of a portion of the blocks of FIG. 4.

FIG. 5 shows in more detail a particular form of the circuitry of the invention, which circuitry can be formed as a single module unit, as discussed above. Such module includes the means for shaping the variable frequency oscillator and reference oscillator signals to effective pulsed forms, the appropriate phase detector circuitry, the digital to analog converter and the low-pass filter circuitry, all of which effectively correspond to the circuits as shown in FIG. 4.

Because of the use of a digital phase detection and subsequent analog conversion, critical portions of the control system circuitry can be formed as integrated circuits in configurations presently available to the art. For example, limiter circuitry for producing quantized, or pulsed, information from appropriately amplified analog signals is available in integrated circuit form. In addition, the required phase detection circuitry, D/A conversion circuitry, and low-pass filter circuitry are also effectively available through the use of known integrated circuitry, as discussed in some detail below in connection with FIG. 5.

As shown in FIG. 5, the conversion of the input variable and reference phase signals, $\theta_{var}$ and $\theta_{ref}$, respectively, to pulsed form is achieved through appropriate wave shaping circuitry, shown here as including transistor amplifiers 49 and 50, respectively, and suitable limiter circuitry 51 and 52 connected at the outputs thereof. As mentioned above, the limiter circuitry is readily available as an integrated circuit chip, shown enclosed by dashed line 53, one form of which is manufactured and sold as integrated circuit chip, Model MC5400L, by Motorola Corporation, Chicago, Ill.

Figure 6:
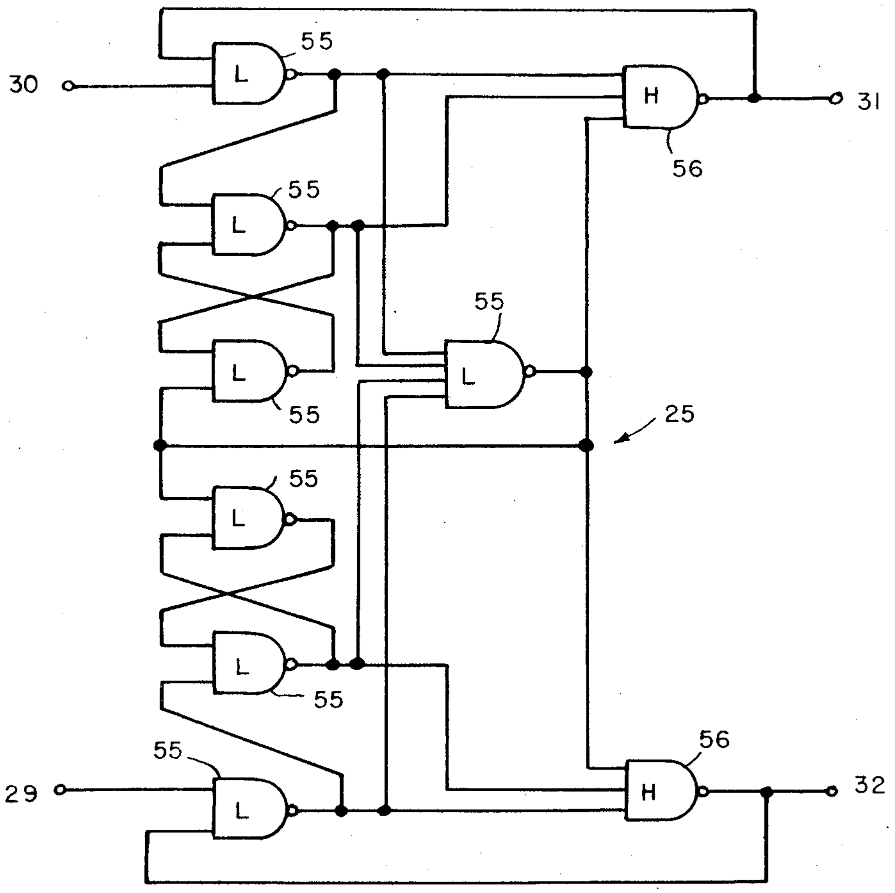
FIGS. 6, 6A and 6B show further details of the circuit diagram of FIG. 5.

Further, FIG. 5 shows the use of an integrated circuit, identified therein by dashed line 28, which is used to provide the phase-detection, D/A conversion and a portion of the low-pass filter operation. Such circuitry is available as integrated circuit chip, Model MC4344L, also from Motorola Corporation. As seen therein, such integrated circuit chip has input terminals 29 and 30 to which the variable and reference phase signals obtained in pulsed form from limiters 51 and 52 can be fed to the circuit 25 which effectively performs the operation of subtracting the reference signal $\theta_{ref}$ from the variable signal $\theta_{var}$ and detecting the phase difference therebetween. The details of such circuitry are shown in FIG. 6. The output of circuit 25, which represents the phase difference between the input signals in digital form is available at terminals 31 and 32 which can be externally connected directly to terminals 33 and 34 which feed digital to analog conversion circuitry 35. The latter circuit is sometimes referred to by the integrated circuit chip manufacturer as a "charge pump" circuit and effectively provides digital to analog conversion and is shown in more detail in FIG. 6A. The output terminals 35 and 36 of the latter circuit are then externally connected to resistors 37 and 38, each of which represent the resistance $R_1$ in the above calculations. Such resistors are connected at a common junction point to the base of a transistor 39 having a feedback loop connected from its collector to its base through a capacitor 40 representing the capacitance C in the above calculations, and resistor 41, representing the resistance $R_2$ in the above calculations. The collector and emitter of transistor 39 are connected to terminals 42 and 43 of the integrated circuit ship which are in turn connected to amplifier circuitry 44 which can be considered as part of the overall low-pass filter circuit and is shown in more detail in FIG. 6B. The emitter of transistor 39 is appropriately grounded through a suitable resistor 45 while the voltage for the collector thereof is connected to an appropriate power supply circuitry through resistor 46 and inductor 47, terminal 48 of the integrated circuit chip also being connected to the power supply for providing power to the detector unit, and terminal 49 being connected to ground.

It has been found that, while theoretically a value of 1$\mu$farad can be used for capacitance 40 to achieve the desired operation, the system in practice is subject to undesirable transient effects when the radio set is initially turned on. In order to overcome such initial transient problems, the value of capacitance 40 is set at 22 $\mu$ farads in one preferred embodiment of the invention. With such value the overall time delay characteristics of the circuitry are increased so that the effect of the initial transient is minimized. However, it has been further found that the change in capacitance value does not adversely affect the operation of the frequency control circuit and lock-in to the correct frequency signal is still readily achieved.

Figure 6A:
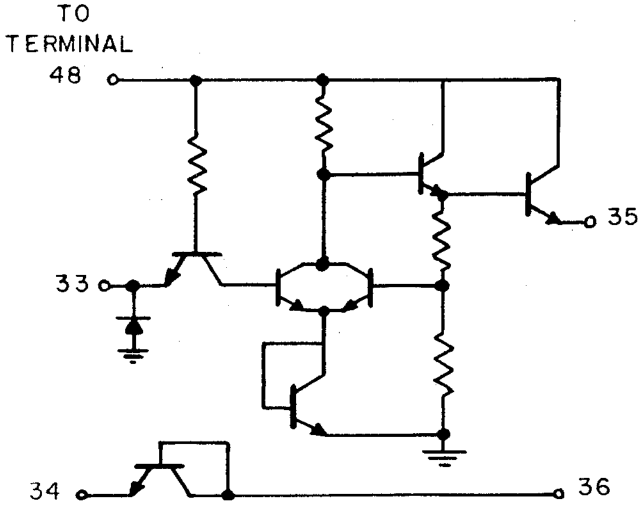
Figure 6B:
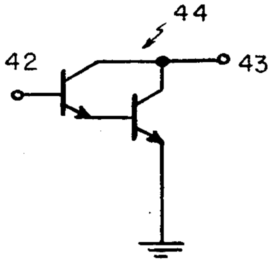

The details of circuits 25, 35 and 44 are shown in FIGS. 6, 6A and 6B, all such circuits being formed on integrated circuit chip 28, as discussed above. Thus, FIG. 6 depicts an appropriate combination of low-level "NAND" gates 55 and high-level "NAND" gates 56, which provides output signals at terminals 31 and 32 representing a plurality of positive and negative pulses of constant amplitude, the relationship between the numbers of positive and negative digital pulses representing the detected phase difference between the input signals at terminals 29 and 30.

The charge pump circuit shown in FIG. 6A accepts the signals at terminals 33 and 34 (which are externally connected to terminals 31 and 32) to produce output signals at terminals 35 and 36 so as to effectively convert the input pulses to analog form which is then smoothed by the filter circuit to provide a d-c voltage signal proportional to the phase detected error signal $\theta_e$, which voltage signal is used to control the frequency of the variable frequency oscillator output signal. Such latter signal is available at the output terminal 43 of amplifier 44, the input terminal 42 of which is connected to the emitter of transistor 39.

Thus, the overall circuitry including both integrated circuit chips 28 and 53 as well as their associated external circuit elements, as shown in FIG. 5, can be formed as a single module unit to provide the operation discussed above in connection with the calculation of the overall transfer function of the system depicted in FIGS. 2, 3 and 4. Because integrated circuit chips of the MC4344L and MC5400L forms are readily available and adaptable to the particular use shown herein, the overall system of the invention using both digital and analog circuitry to produce a control system in a single modular form provides the previously discussed advantages over the prior art system. Moreover, the integrated circuit chip units which are utilized have inherent temperature stability characteristics and it is not necessary to utilize any temperature compensating circuitry, as was often required in the prior art system. The ability to form the overall circuitry as a single module permits ready retro-fitting of previously fabricated dual module systems which may be in use in the field, the new module unit being appropriately designed to be substituted for the dual module units of the prior equipment without the necessity for redesign of the remaining part of the overall equipment. The alignment problems inherent with the dual module system are then obviated and the overall system becomes more dependable in use, particularly where many frequency channels are needed and the frequency separation is relatively small so that the need for locking on to the correct frequency channel to achieve effective communication is of the essence.

I claim:

1. A frequency control system for controlling the frequency of a variable frequency output signal from a variable frequency oscillator, said system comprising a reference oscillator means for producing a reference frequency signal in analog form;

first means responsive to said reference frequency signal for producing a reference signal in pulsed form representing the phase of said reference frequency signal;

second means responsive to said variable frequency signal in analog form for producing a variable signal in pulsed form representing the phase of said variable frequency signal;

means for comparing the phases of said pulsed reference signal and said pulsed variable signal for producing a digital phase difference signal;

means for converting said digital phase difference signal from digital form to analog form;

active filter means responsive to said analog phase difference signal for producing a control signal for controlling the frequency of said variable frequency output signal, said active filter means having a transfer characteristic in the frequency domain of the form $$R_2\, Cs{+}1/R_1\, Cs$$

wherein $R_1$ and $R_2$ are the values of resistances and $C$ is the value of the capacitance in said filter, which resistances and capacitance determine the time constants of said active filter.

2. A frequency control system for controlling the frequency of a variable frequency output signal from a variable frequency oscillator, said system comprising a reference oscillator means for producing a reference frequency signal in analog form;

first means responsive to said reference frequency signal for producing a reference signal in pulsed form representing the phase of said reference frequency signal;

second means responsive to said variable frequency signal in analog form for producing a variable signal in pulsed form representing the phase of said variable frequency signal;

phase comparing means responsive to said pulsed reference signal and said pulsed variable signal for providing two output comparison signals;

converting means responsive to said two output comparison signals to produce two output phase difference signals in analog form; and active filter means having two input channels responsive to said two output phase difference signals for producing a single output control signal for controlling the frequency of said variable frequency output signal.

* * * * *